United States Patent [19]

Sittig

[11] 4,223,332
[45] Sep. 16, 1980

[54] THYRISTOR HAVING AN ANODE TRANSVERSE FIELD EMITTER

[75] Inventor: Roland Sittig, Umiken, Switzerland

[73] Assignee: BBC Brown, Boveri & Company, Limited, Baden, Switzerland

[21] Appl. No.: 950,320

[22] Filed: Oct. 11, 1978

[30] Foreign Application Priority Data

Dec. 21, 1977 [CH] Switzerland ............ 15759/77

[51] Int. Cl.$^2$ ............................................ H01L 29/74
[52] U.S. Cl. ...................................... 357/38; 357/20; 357/86
[58] Field of Search ............... 357/38, 39, 86, 20

[56] References Cited

U.S. PATENT DOCUMENTS

| | | | |
|---|---|---|---|
| 3,360,696 | 12/1967 | Neilson et al. | 357/39 |
| 3,599,061 | 8/1971 | Kokosa | 357/86 |
| 3,964,091 | 6/1976 | Berndes et al. | 357/39 |
| 4,053,922 | 10/1977 | Ferro | 357/86 |
| 4,089,024 | 5/1978 | Tanaka | 357/39 |
| 4,150,390 | 4/1979 | Jacklin | 357/86 |

OTHER PUBLICATIONS

A. Munoz-Yague et al., "Optimum Design of Thyristor Gate-Emitter Geometry," IEEE Trans. on Elec. Dev., vol. EO-23#8, Aug. 1976, pp. 917-924.

*Primary Examiner*—Joseph E. Clawson, Jr.
*Attorney, Agent, or Firm*—Oblon, Fisher, Spivak, McClelland & Maier

[57] ABSTRACT

A thyristor exhibiting improved maximum current rise rates as a result of the relocation of the ignition front from the edge of the cathode emitter zone to inner cathode emitter areas. This relocation is effected by providing a relatively light doping of the anode zone beneath the thyristor gate and cathode emitter edge, and a relatively higher anode zone doping opposite and outside of the cathode edge, while not applying an anode electrode metal coating to the lightly doped area of the anode zone. The thyristor utilizes cathode emitter short circuit rings arranged such that the ignition front which occurs at thyristor triggering bypasses the short circuit ring immediately adjacent the cathode emitter edge, thereby increasing the thyristor voltage rise velocity, dU/dt.

8 Claims, 4 Drawing Figures

THYRISTOR HAVING AN ANODE TRANSVERSE FIELD EMITTER

BACKGROUND OF THE INVENTION

1. Field of the Invention

The invention relates to a thyristor, controllable on the cathode side, with emmitter short-circuits distributed on the cathode surface.

2. Description of the Prior Art

The ignition arrangements used today for thyristors are almost uniformly based on a suitable structuring of the gate-cathode area. The structure parameters are known for such arrangements for the setting of the desired ignition current at a given voltage and current rise velocity (cf., for example, Hartmann, *IEEE ED*-23, August 1976, Pages 912-917). Owing to technological restrictions and the mutual interrelationship of different characteristics, these lead, however, to difficulties in practice. In particular, a compromise must be found between sufficient dU/dt strength and as high a current rise speed, dI/dt, as possible for the arrangement of the emitter short-circuits closest to the gate-side cathode edge.

SUMMARY OF THE INVENTION

Accordingly, it is the object of this invention to create a thyristor with which it is possible to establish, in a simple manner, the desired ignition currents as well as the dynamic values for the voltage and current rise.

This and other objects have been achieved according to this invention by the fact that the anode zone of the thyristor has, along its anode zone at the anode major surface, two areas and adjacent to each other of different doping, that the lower doped area is at least opposite the gate-side edge area of the cathode emitter and that only the higher doped area is provided with an anode metal coating.

By means of this measure, it is achieved that no ignition duct is formed, as in the case of known thyristors, below the gate-side cathode edge but that the ignition is only effected in the area of the highly doped area edge on the anode side or in the area of the edge of the metal coating, as a result of the electrical ohm field as well as the limited injection capability. This shifting of the ignition duct from the cathode edge to inner cathode emitter areas results, at a maximum, in still admissible current rise velocities, dI/dt, which can, at least, be higher by the factor 2 than in the case with thyristors with a uniformly doped anode edge zone.

An anode zone structured in this manner can also be applied with other gate structures, such as amplifying gate and junction gate structures, in an advantageous way.

The new thyristor has proven to be particularly advantageous in case of thyristors in which the emitter short-circuits closest to the gate form a continuous ring. Besides the higher current rise velocity, such thyristors have a particularly high dU/dt strength. However, in the case of customary thyristors, the spreading ignition front would be detained at the short-circuit ring and, thus, the thyristor would be destroyed with a high dI/dt. On the other hand, in the case of the new thyristor, the short-circuit ring is skipped by the ignition front owing to the fact that the hole injection is shifted to the edge of the highly doped area by means of the transverse field produced on the anode with the ignition. However, the prerequisite is that the higher doped anode area is opposite that part of the cathode emitter which is outside the emitter short-circuit ring.

In order not to change perceptibly the admissible current load of the thyristor, the diameter of the inner edge of the higher doped anode area cannot arbitrarily be chosen but, preferably, it is opposite those points of the cathode emitter which are between the emitter short-circuits closest to the gate and the short-circuits being always next further towards the outside.

If the individual emitter short-circuits are arranged around the gate (control electrode) in the form of a ring, then the inner edge of the higher doped area is, preferably, always opposite those points of the cathode emitter which are defined by the distance $R_{S1} + D/2$ measured from the center point of the gate, where $R_{S1}$ represents the distance from the gate to the ring on which the emitter short-circuits closest to the gate are placed, and D signifies the distance between $R_{S1}$ and the distance $R_{S2}$ on which always the next closest ring of emitter short-circuits are placed.

The thyristor of the invention offers, therefore, an additional degree of freedom when dimensioning gate structures. The arrangement contains, additionally, internal ignition-intensification characteristics as has also the known cathode transverse field emitter (cf. J. Burtscher: "Thyristors with internal ignition intensification, Dynamic Problems Of Thyristor Techniques"; VDE-Verlag (Publisher) 1971; pages 128 and on). But it can also be combined with other known structure, such as, for example, with an amplifying gate or with a junction gate (cf. also in this case the above cited paper by J. Burtscher). Finally, the new thyristor design, especially in connection with the emitter short-circuit ring, can also be utilized for reverse-conducting thyristors.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein.

DETAILED DESCRIPTION OF THE PREFERRED EMBODIMENTS

Figure 1:
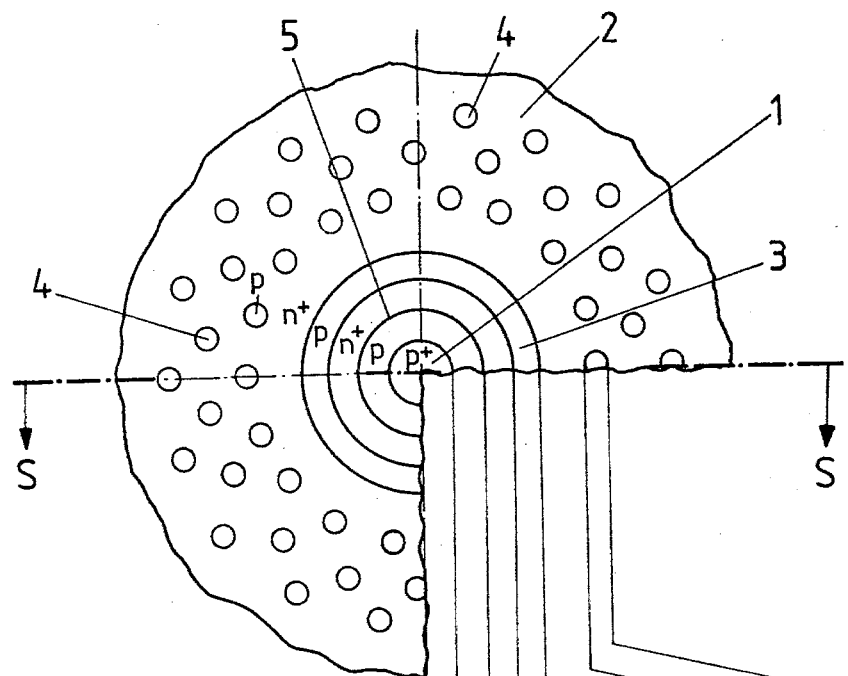
FIG. 1 is a top cross-sectional view of a thyristor with an emitter short-circuit ring being placed symmetrically to the gate (for reasons of clarity, the contact metal coating of the cathode and of the gate are omitted)

Referring now to the drawings, wherein like reference numerals designate identical or corresponding parts throughout the several views, and more particularly to FIG. 1 thereof, it is firstly noted that the thyristor gate has the reference 1, the cathode emitter zone the reference 2, the emitter short-circuit ring the reference 3 and individual emitter short-circuit points the reference 4. Between the gate-side emitter zone edge 5 and the edge of gate 1, a part of the P-basis zone is visible in which the highly doped (p+-) gate 1 is embedded (cf. also FIG. 2). The distance between the short-circuits 4 closest to the emitter short-circuit ring 3 and the ring 3 can be larger than the distance between the emitter short-circuits 4 being placed further towards the outside.

Figure 2:
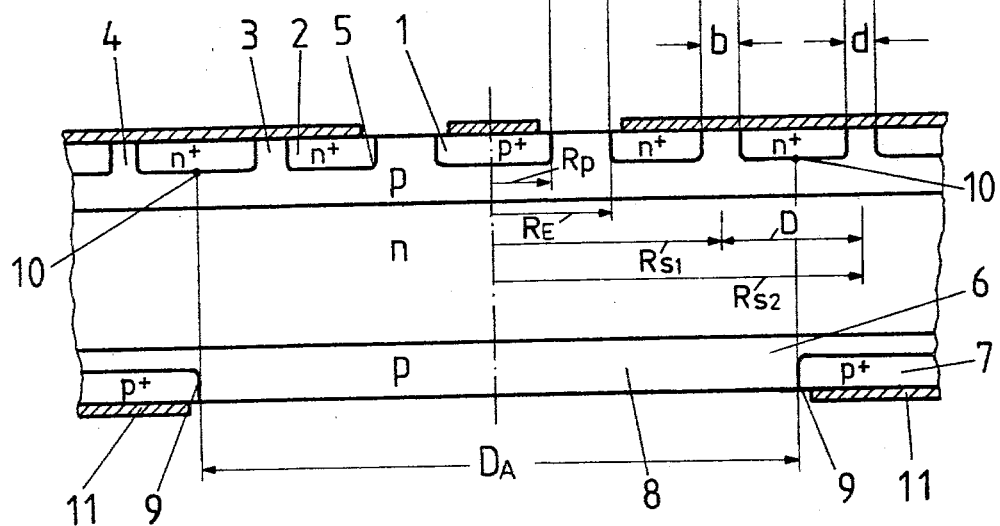
FIG. 2 is a cross-sectional view taken through the thyristor according to FIG. 1 along the line s-s, in an enlarged representation, and with cathode, anode and gate contact metal coating.

The zone sequence and the structure of the anode zone 6 as well as the structure of the contact metal coating of gate, emitter and anode zones can be noted from FIG. 2. In this instance the anode metal coating is given the reference 11. The p-doped anode zone 6 has the areas 7 and 8 at its edge zone on the upper side whereby the concentration of the disturbance centers is high on the surface of the semiconductor disk in the area 7 but considerably lower in the area 8.

The edge 9 of the highly doped (p+-) area 7, is, in accordance with the invention, about opposite to those points 10 of the emitter 2 which are defined by the distance $R_{S1} + D/2$ from the center point of the gate.

Figure 3:
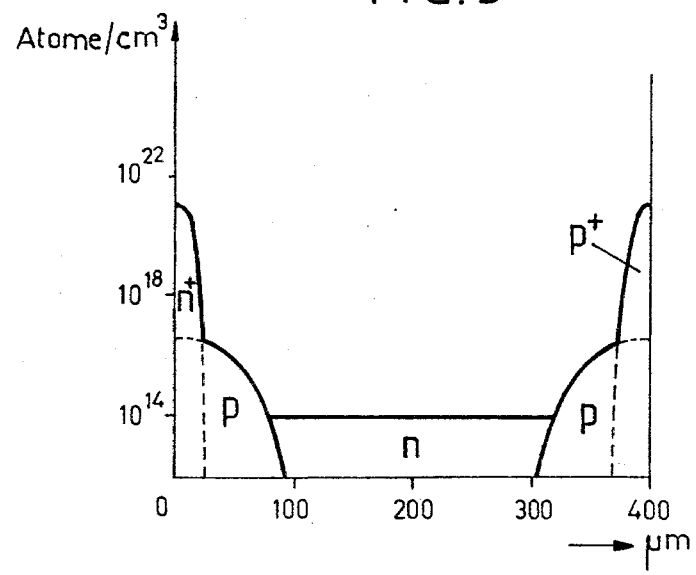
FIG. 3 is a graph illustrating the doping course for a thyristor according to FIG. 2.

FIG. 3 shows a doping profile (concentration of disturbance centers as a function of the penetration depth) as it can, for example, be used with the thyristor of the invention. The thickness of the semiconductor disk of the thyristor amounts to 450 $\mu$m. The concentration of disturbance centers on the anode-side surface amounts, in the area 7, to about $5 \cdot 10^{20}$ atoms/cm$^3$, in the area 8, to about $5 \cdot 10^{16}$ atoms/cm$^3$. The concentration of disturbance centers on the cathode-gate-side surface amounts to about $10^{20}$ atoms/cm$^3$ within the emitter areas (n+-doping) as well as in the emitter short-circuit and gate area (p+-doping). The depth of the respective doping, measured from the cathode-side surface, amounts to about 15 $\mu$m for the gate 1 and the cathode emitter. The lateral structure (cf. FIG. 1 and 2) has the following values in the case of this thyristor:

Distance from the center point of the gate to
the edge of the gate ($R_P$): 1500 $\mu$m
the edge of the emitter ($R_E$): 1800 $\mu$m
the center of the short-circuit ring ($R_{S1}$): 2300 $\mu$m
to the center of the adjacent emitter short circuits ($R_{S2}$): 3600 $\mu$m
Width of the emitter short-circuit ring (b): 200 $\mu$m
diameter of the individual short-circuit hole (d) = 200 $\mu$m
Diameter of the low-doped area ($D_A$) = 5700 $\mu$m The 18 short-circuit holes 4 closest to the emitter short-circuit ring 3 are uniformly arranged on the ring with the distance $R_{S2}$ from the center point of the gate. The emitter short-circuits 4, being placed further towards the outside, can have a hexagonal arrangement proceeding from this ring. In this instance, the distance of the individual emitter short-circuits 4 from each other shall not amount to more than 1200 $\mu$m.

The still admissible current rise velocity, dI/dt, measured with this thyristor amounted to 300 A/$\mu$s and was thus more than twice as high than in the case of equally dimensioned thyristors with normal gate arrangement and equal length of the cathode edge.

Figure 4:
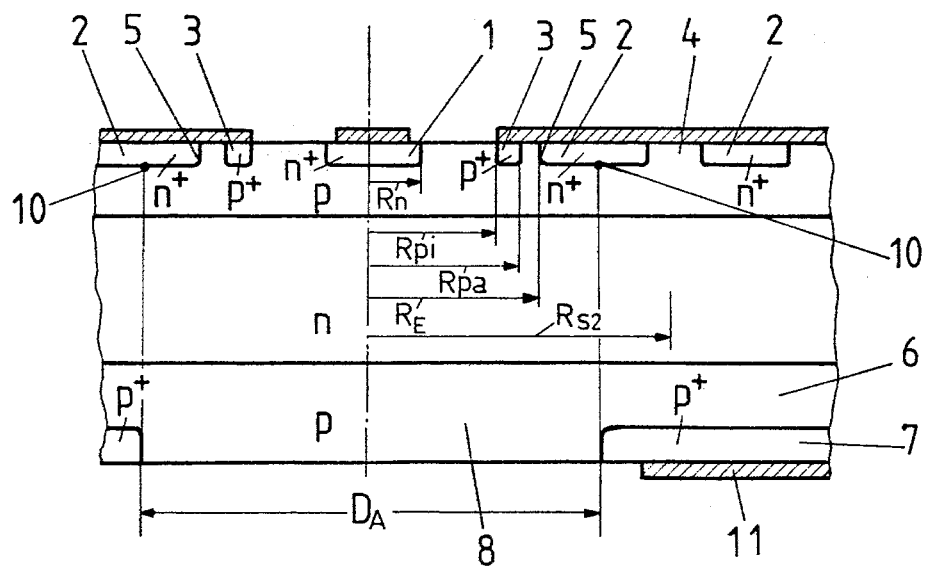
FIG. 4 is a side cross-sectional view taken through a thyristor with a junction gate.

FIG. 4 shows an additional design example: A thyristor with a so-called junction gate, i.e. a gate with n+-doping. In this case, the emitter short-circuit ring 3 is closer to the gate than the gate-side cathode edge 5 whereby a particularly high dU/dt strength is obtained. The doping profile corresponded essentially with the profile given in FIG. 3. The following values were obtained for the lateral structure:

Distance from the center point of the gate to
the edge of the gate ($R_n$) +1500 $\mu$m
the p+-emitter short circuit ring, inside (Rpi): 1600 $\mu$m
the p+-emitter short circuit ring, outside (Rpa): 1750 $\mu$m
the $n^{30}$-inner cathode edge ($R_E$): 1800 $\mu$m
the center of the next emitter short-circuits ($R_{S2}$): 3000 $\mu$m
Diameter of the low-doped area ($D_A$): 4500 $\mu$m Sixteen short-circuit holes are uniformly arranged on the ring with the radius $R_{S2}$. The diameter of an individual short-circuit hole 4 amounts again to 200 $\mu_M$.

It goes without saying that the invention is not limited to thyristors with circular-symmetrical gate and emitter structures but it can, for example, also be utilized with thyristors with a finger-shaped or square gate.

Obviously numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. In a thyristor formed of a semiconductor body having cathode and anode major surfaces separated by four zones of alternatingly opposite conductivity type, with a cathode emitter zone and an anode zone respectively facing said cathode and anode major surfaces, and cathode base and anode base zones respectively facing said cathode emitter and anode zones and each other, wherein portions of said cathode base zone are brought up through said cathode emitter zone to form emitter short-circuits in said cathode surface, said thyristor having a gate zone of a conductivity type opposite to that of said cathode emitter formed in a portion of said cathode base zone brought up to said cathode surface, the improvement comprising:
said anode zone having a higher doped area and a lower doped area which are disposed facing said anode major surface, with the lower doped area opposite said gate zone such that the orthogonal projection of said lower doped zone to said cathode surfaces covers at least said gate zone; and,
said cathode emitter zone, said gate zone, and only said higher doped area of said anode zone coated with a metal electrode for making contact thereto.

2. A thyristor according to claim 1, wherein said emitter short-circuits circumscribe said gate zone, further comprising:
said higher doped area of said anode zone disposed opposite that part of the cathode emitter zone which is outside a polygonal course defined by a projected connection of the emitter short-circuits closest said gate zone such that the orthogonal projection of said higher doped area covers said part of the cathode emitter zone outside said polygonal course.

3. A thyristor according to claim 2, further comprising:
the emitter short-circuits closest to the gate zone forming a continuous ring.

4. A thyristor according to claim 1, further comprising:
an amplifying gate.

5. A thyristor according to claim 1, further comprising:
a junction gate.

6. A thyristor according to claim 1, wherein the thyristor is a reverse conducting thyristor.

7. In a thyristor formed of a semiconductor body having cathode and anode major surfaces separated by four zones of alternatingly opposite conductivity type, with a cathode emitter zone and an anode zone respectively facing said cathode and anode major surfaces, and cathode base and anode base zones respectively facing said cathode emitter and anode zones and each other, wherein portions of said cathode base zone are brought up through said cathode emitter zone to form emitter short-circuits in said cathode surface, said thyristor having a gate zone of a conductivity type opposite to that of said cathode emitter formed in a portion of said cathode base zone brought up to said cathode surface, the improvement comprising:

said anode zone having a higher doped area and a lower doped area which are disposed facing said anode major surface, with the lower doped area opposite said gate zone such that the orthogonal projection of said lower doped zone to said cathode surface covers at least said gate zone;

said cathode emitter zone, said gate zone, and only said higher doped area of said anode zone coated with a metal electrode for making contact thereto;

said emitter short-circuits circumscribing said gate zone and said emitter short circuits being arranged around said gate zone in a plurality of concentric rings in which a first ring closest to said gate zone is separated therefrom by a distance $R_{S1}$ and a second ring second closest to said gate zone is separated therefrom by a distance $R_{S2}$, where the difference between $R_{S2}$ and $R_{S1}$ equals a distance D;

the higher doped zone of said anode zone having an inner edge the orthogonal projection of which is closest to said gate zone by a distance equal to $R_{S1}+D/2$, said higher doped zone having an orthogonal projection which covers the entire cathode surface outside said distance equal to $R_{S1}+D/2$; and said higher doped area of said anode zone disposed opposite that part of the cathode emitter zone which is outside a polygonal course defined by a projected connection of the emitter short-circuits closest said gate zone such that the orthogonal projection of said higher doped area covers said part of the cathode emitter zone outside said polygonal course.

8. In a thyristor formed of a semiconductor body having cathode and anode major surfaces separated by four zones of alternatingly oppsite conductivity type, with a cathode emitter zone and an anode zone respectively facing said cathode and anode major surfaces, and cathode base and anode base zones respectively facing said cathode emitter and anode zones and each other, wherein portions of said cathode base zone are brought up through said cathode emitter zone to form emitter short-circuits in said cathode surface, said thyristor having a gate zone of a conductivity type opposite to that of said cathode emitter formed in a portion of said cathode base zone brought up to said cathode surface, the improvement comprising:

said anode zone having a higher doped area and a lower doped area which are disposed facing said anode major surface, with the lower doped area opposite said gate zone such that the orthogonal projection of said lower doped zone to said cathode surfaces covers at least said gate zone;

said cathode emitter zone, said gate zone, and only said higher doped area of said anode zone coated with a metal electrode for making contact thereto;

said emitter short-circuits circumscribing said gate zone and said emitter short circuits being arranged around said gate zone in a plurality of concentric rings in which a first ring closest to said gate zone is separated therefrom by a distance $R_{S1}$, a second ring second closest to said gate zone is separated therefrom by a distance $R_{S2}$, where the difference between $R_{S2}$ and $R_{S1}$ equals a distance D and other rings outside said second emitter short-circuit ring are separated therefrom by a distance less than said distance D;

the higher doped zone of said anode zone having an inner edge the orthogonal projection of which is closest to said gate zone by a distance equal to $R_{S1}+D/2$, said higher doped zone having an orthogonal projection which covers the entire cathode surface outside said distance equal to $R_{S1}+D/2$; and said higher doped area of said anode zone disposed opposite that part of the cathode emitter zone which is outside a polygonal course defined by a projected connection of the emitter short-circuits closest said gate zone such that the orthogonal projection of said higher doped area covers said part of the cathode emitter zone outside said polygonal course.

* * * * *